US012720965B2

(12) United States Patent
Yamamoto et al.

(10) Patent No.: US 12,720,965 B2
(45) Date of Patent: Aug. 25, 2026

(54) DISPLAY DEVICE AND MANUFACTURING METHOD THEREOF

(71) Applicant: Magnolia White Corporation, Tokyo (JP)

(72) Inventors: Yuya Yamamoto, Tokyo (JP); Nobuo Imai, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 449 days.

(21) Appl. No.: 18/515,318

(22) Filed: Nov. 21, 2023

(65) Prior Publication Data

US 2024/0179957 A1 May 30, 2024

(30) Foreign Application Priority Data

Nov. 30, 2022 (JP) ................................ 2022-191820

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
CPC ......................... H10K 59/122; H10K 59/1201
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2019/0363275 A1 | 11/2019 | Ochi et al. | |
| 2022/0077251 A1 | 3/2022 | Choung et al. | |
| 2023/0413664 A1 * | 12/2023 | Haketa .................. | C09K 11/06 |

FOREIGN PATENT DOCUMENTS

| | | | | |
|---|---|---|---|---|
| CN | 121038542 A * | 11/2025 | ............ | H10K 59/12 |
| JP | 2000-195677 A | 7/2000 | | |
| JP | 2004-207217 A | 7/2004 | | |
| JP | 2008-135325 A | 6/2008 | | |
| JP | 2009-032673 A | 2/2009 | | |
| JP | 2010-118191 A | 5/2010 | | |
| WO | 2018/179308 A1 | 10/2018 | | |

* cited by examiner

*Primary Examiner* — Joseph L Williams
(74) *Attorney, Agent, or Firm* — XSENSUS LLP

(57) ABSTRACT

According to one embodiment, a manufacturing method of a display device includes forming a lower electrode, forming an insulating layer which covers the lower electrode, forming a partition which includes a lower portion located on the insulating layer and formed of a conductive material and an upper portion located on the lower portion and protruding from a side surface of the lower portion, forming an aperture which overlaps the lower electrode by patterning the insulating layer, forming an organic layer including a light emitting layer, on the lower electrode, and forming an upper electrode which covers the organic layer and is in contact with the lower portion of the partition. The insulating layer is formed of tetraethoxysilane (TEOS).

20 Claims, 17 Drawing Sheets

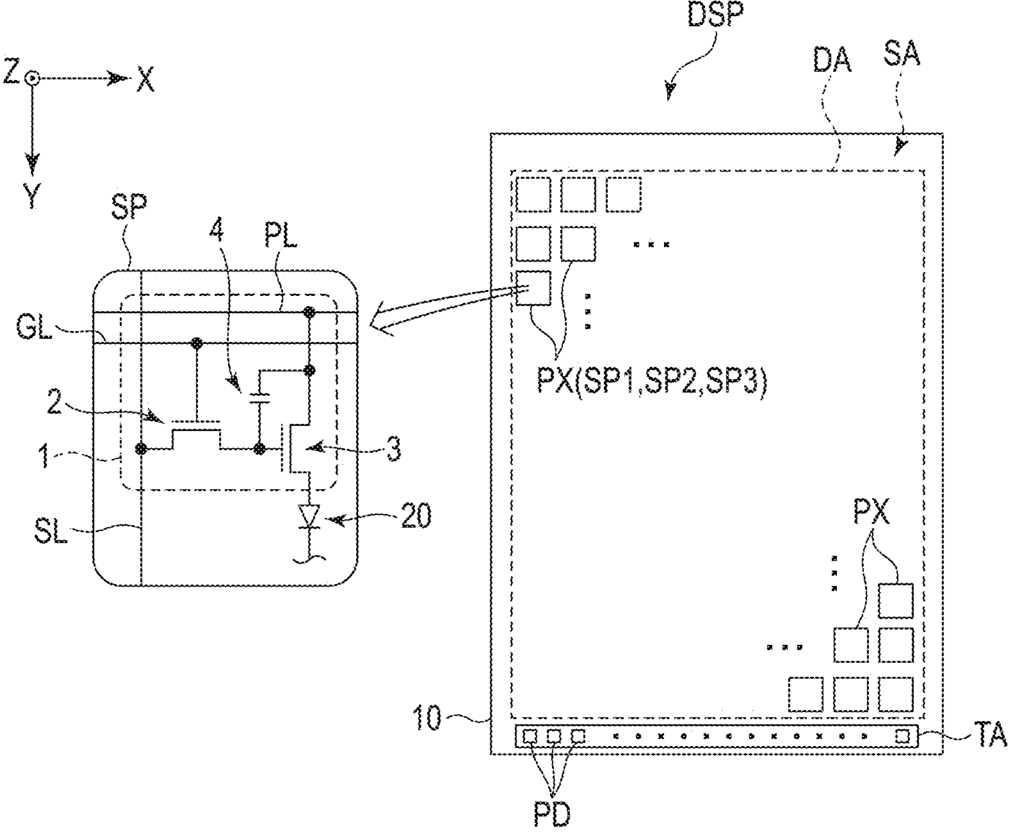
F I G. 1

DA
SP1
L2
IL
L1
R2
SP2
R2
SP3
LE1
LE2
LE3
12

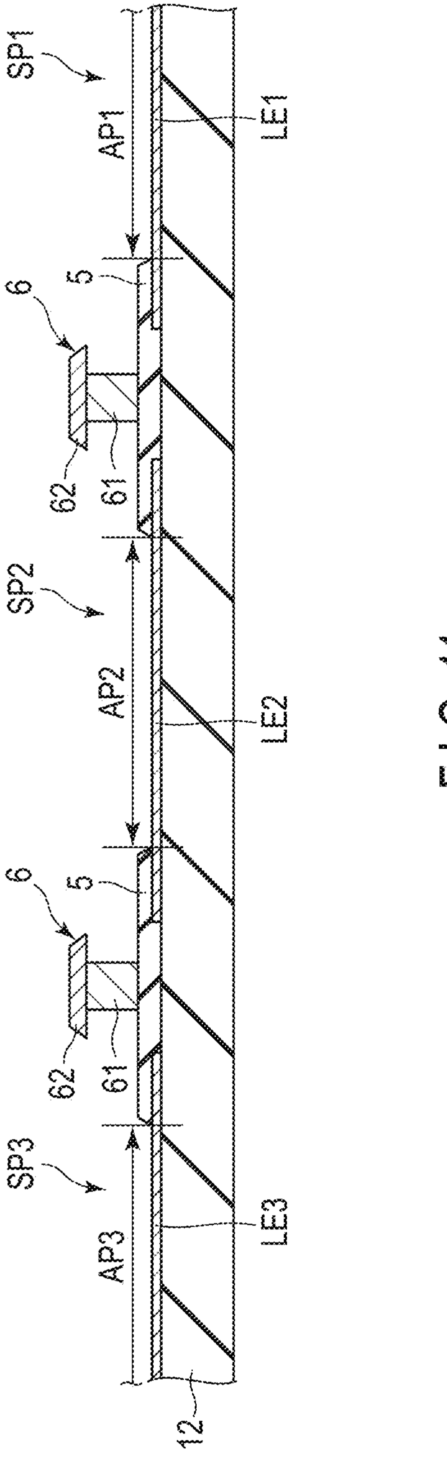
F I G. 11

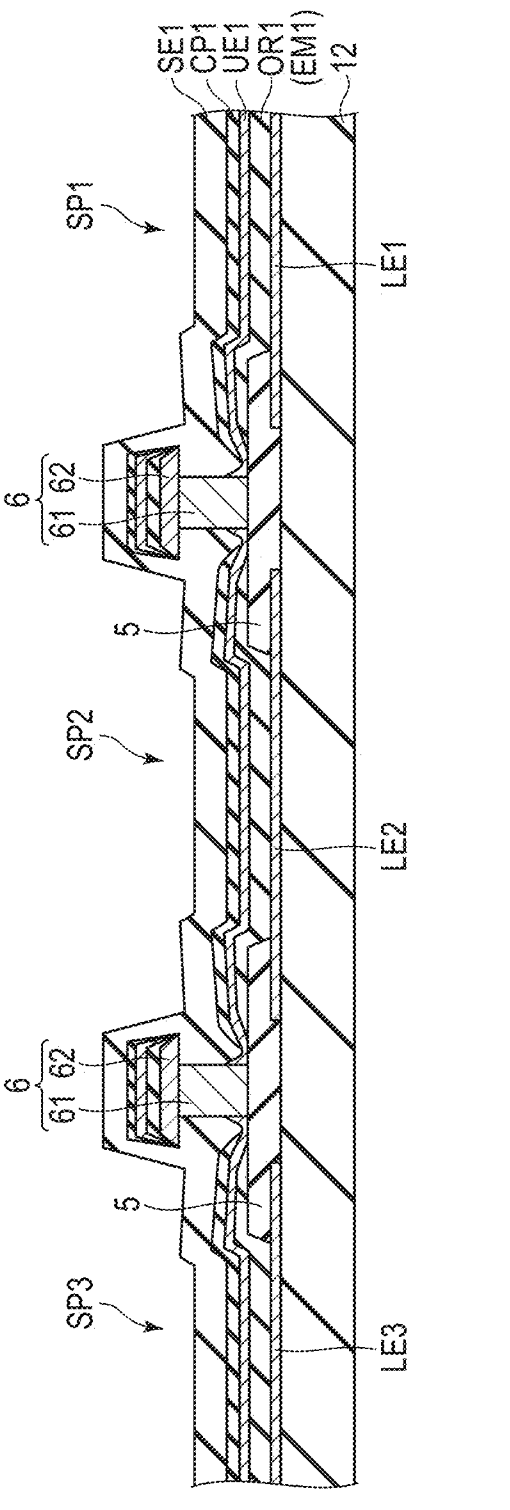
F I G. 12

DISPLAY DEVICE AND MANUFACTURING METHOD THEREOF

CROSS-REFERENCE TO RELATED APPLICATIONS

This application is based upon and claims the benefit of priority from Japanese Patent Application No. 2022-191820, filed Nov. 30, 2022, the entire contents of which are incorporated herein by reference.

FIELD

Embodiments described herein relate generally to a display device and a manufacturing method thereof.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole transport layer and an electron transport layer in addition to a light emitting layer.

In the process of manufacturing such a display element, a technique which prevents the reduction in reliability is required.

BRIEF DESCRIPTION OF THE DRAWINGS

FIG. 1 is a diagram showing a configuration example of a display device DSP.

FIG. 11 is a diagram for explaining the manufacturing method of the display device DSP.

FIG. 12 is a diagram for explaining the manufacturing method of the display device DSP.

DETAILED DESCRIPTION

Figure 2:
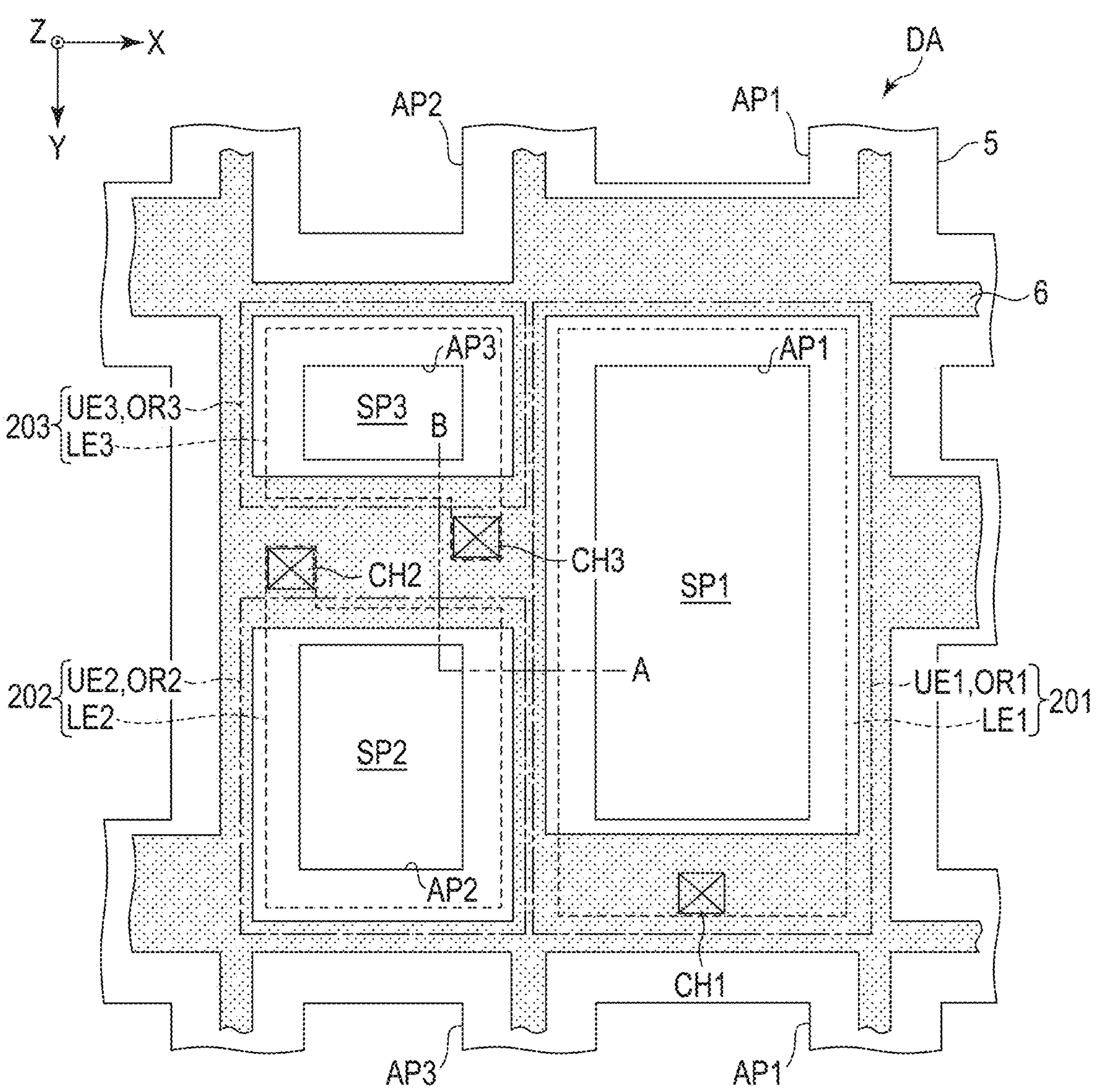
FIG. 2 is a diagram showing an example of the layout of subpixels SP1, SP2 and SP3.

Embodiments described herein aim to provide a display device and a manufacturing method thereof such that the reduction in reliability can be prevented.

In general, according to one embodiment, a manufacturing method of a display device comprises forming a lower electrode, forming an insulating layer which covers the lower electrode, forming a partition which comprises a lower portion located on the insulating layer and formed of a conductive material and an upper portion located on the lower portion and protruding from a side surface of the lower portion, forming an aperture which overlaps the lower electrode by patterning the insulating layer, forming an organic layer including a light emitting layer, on the lower electrode, and forming an upper electrode which covers the organic layer and is in contact with the lower portion of the partition. The insulating layer is formed of tetraethoxysilane (TEOS).

According to another embodiment, a manufacturing method of a display device comprises forming a lower electrode, forming a first insulating layer which covers the lower electrode, forming a second insulating layer on the first insulating layer, forming a partition which comprises a lower portion located on the second insulating layer and formed of a conductive material and an upper portion located on the lower portion and protruding from a side surface of the lower portion, forming an aperture which overlaps the lower electrode by patterning the second insulating layer and the first insulating layer in series, forming an organic layer including a light emitting layer, on the lower electrode, and forming an upper electrode which covers the organic layer and is in contact with the lower portion of the partition. The first insulating layer is formed of tetraethoxysilane (TEOS).

According to yet another embodiment, a display device comprises a substrate, a lower electrode provided above the substrate, a rib which covers an end portion of the lower electrode and comprises an aperture overlapping the lower electrode, a partition which comprises a lower portion provided on the rib and formed of a conductive material and an upper portion provided on the lower portion and protruding from a side surface of the lower portion, an organic layer provided on the lower electrode and including a light emitting layer, and an upper electrode which covers the organic layer and is in contact with the lower portion of the partition. The rib is formed of tetraethoxysilane (TEOS).

According to yet another embodiment, a display device comprises a substrate, a lower electrode provided above the substrate, a rib which comprises an aperture overlapping the lower electrode, a partition which comprises a lower portion provided on the rib and formed of a conductive material and an upper portion provided on the lower portion and protruding from a side surface of the lower portion, an organic layer provided on the lower electrode and including a light emitting layer, and an upper electrode which covers the organic layer and is in contact with the lower portion of the partition. The rib comprises a first rib layer which covers an end portion of the lower electrode and is formed of tetraethoxysilane (TEOS), and a second rib layer provided on the first rib layer and formed of an inorganic insulating material which is different from the first rib layer.

The embodiments can provide a display device and a manufacturing method thereof such that the reduction in reliability can be prevented.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. When structural elements are viewed in the X-Y plane defined by the first direction X and the second direction Y, the appearance is defined as a plan view. When terms indicating the positional relationships of two or more structural elements, such as "on", "above" "between" and "face", are used, the target structural elements may be directly in contact with each other or may be spaced apart from each other as a gap or another structural element is interposed between them. The positive direction of the Z-axis is referred to as "on" or "above".

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA located on an external side relative to the display area DA on an insulating substrate 10. The substrate 10 may be glass or a resinous film having flexibility.

In the present embodiment, the substrate 10 is rectangular as seen in plan view. It should be noted that the shape of the substrate 10 in plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes subpixel SP1 which exhibits a first color, subpixel SP2 which exhibits a second color and subpixel SP3 which exhibits a third color. The first color, the second color and the third color are different colors. Each pixel PX may include a subpixel SP which exhibits another color such as white in addition to subpixels SP1, SP2 and SP3 or instead of one of subpixels SP1, SP2 and SP3. It should be noted that the combination of subpixels is not limited to three elements. The combination may consist of two elements or may consist of four or more elements by adding subpixel SP4, etc., to subpixels SP1 to SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element.

The surrounding area SA comprises a terminal area TA for connecting an IC chip and a flexible printed circuit. The terminal area TA comprises a plurality of pads (terminals) PD. The pads PD are connected to the terminal of the IC chip and the terminal of the flexible printed circuit.

FIG. 2 is a diagram showing an example of the layout of subpixels SP1, SP2 and SP3.

In the example of FIG. 2, subpixels SP2 and SP3 are arranged in the second direction Y. Subpixels SP1 and SP2 are arranged in the first direction X, and subpixels SP1 and SP3 are arranged in the first direction X.

When subpixels SP1, SP2 and SP3 are provided in line with this layout, in the display area DA, a column in which subpixels SP2 and SP3 are alternately provided in the second direction Y and a column in which a plurality of subpixels SP1 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively.

The partition 6 overlaps the rib 5 as seen in plan view. The partition 6 is formed into a grating shape surrounding the apertures AP1, AP2 and AP3. In other words, the partition 6 comprises apertures in subpixels SP1, SP2 and SP3 in a manner similar to that of the rib 5.

Subpixels SP1, SP2 and SP3 comprise display elements 201, 202 and 203, respectively, as the display elements 20.

The display element 201 of subpixel SP1 comprises a lower electrode LE1, an upper electrode UE1 and an organic layer OR1 overlapping the aperture AP1. The peripheral portion of the lower electrode LE1 is covered with the rib 5. The organic layer OR1 and the upper electrode UE1 are surrounded by the partition 6. The peripheral portion of each of the organic layer OR1 and the upper electrode UE1 overlaps the rib 5 as seen in plan view. The organic layer OR1 includes a light emitting layer which emits light in, for example, a blue wavelength range.

The display element 202 of subpixel SP2 comprises a lower electrode LE2, an upper electrode UE2 and an organic layer OR2 overlapping the aperture AP2. The peripheral portion of the lower electrode LE2 is covered with the rib 5. The organic layer OR2 and the upper electrode UE2 are surrounded by the partition 6. The peripheral portion of each of the organic layer OR2 and the upper electrode UE2 overlaps the rib 5 as seen in plan view. The organic layer OR2 includes a light emitting layer which emits light in, for example, a green wavelength range.

The display element 203 of subpixel SP3 comprises a lower electrode LE3, an upper electrode UE3 and an organic layer OR3 overlapping the aperture AP3. The peripheral portion of the lower electrode LE3 is covered with the rib 5. The organic layer OR3 and the upper electrode UE3 are surrounded by the partition 6. The peripheral portion of each of the organic layer OR3 and the upper electrode UE3 overlaps the rib 5 as seen in plan view. The organic layer OR3 includes a light emitting layer which emits light in, for example, a red wavelength range.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. It should be noted that the outer shapes of the lower electrodes, organic layers or upper electrodes shown in the figure do not necessarily reflect the accurate shapes.

The lower electrodes LE1, LE2 and LE3 correspond to, for example, the anodes of the display elements. The upper electrodes UE1, UE2 and UE3 correspond to the cathodes of the display elements or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

In the example of FIG. 2, the area of the aperture AP1, the area of the aperture AP2 and the area of the aperture AP3 are different from each other. The area of the aperture AP1 is greater than that of the aperture AP2, and the area of the aperture AP2 is greater than that of the aperture AP3. In other words, the area of the lower electrode LE1 exposed from the aperture AP1 is greater than that of the lower electrode LE2 exposed from the aperture AP2. The area of the lower electrode LE2 exposed from the aperture AP2 is greater than that of the lower electrode LE3 exposed from the aperture AP3.

Figure 3:
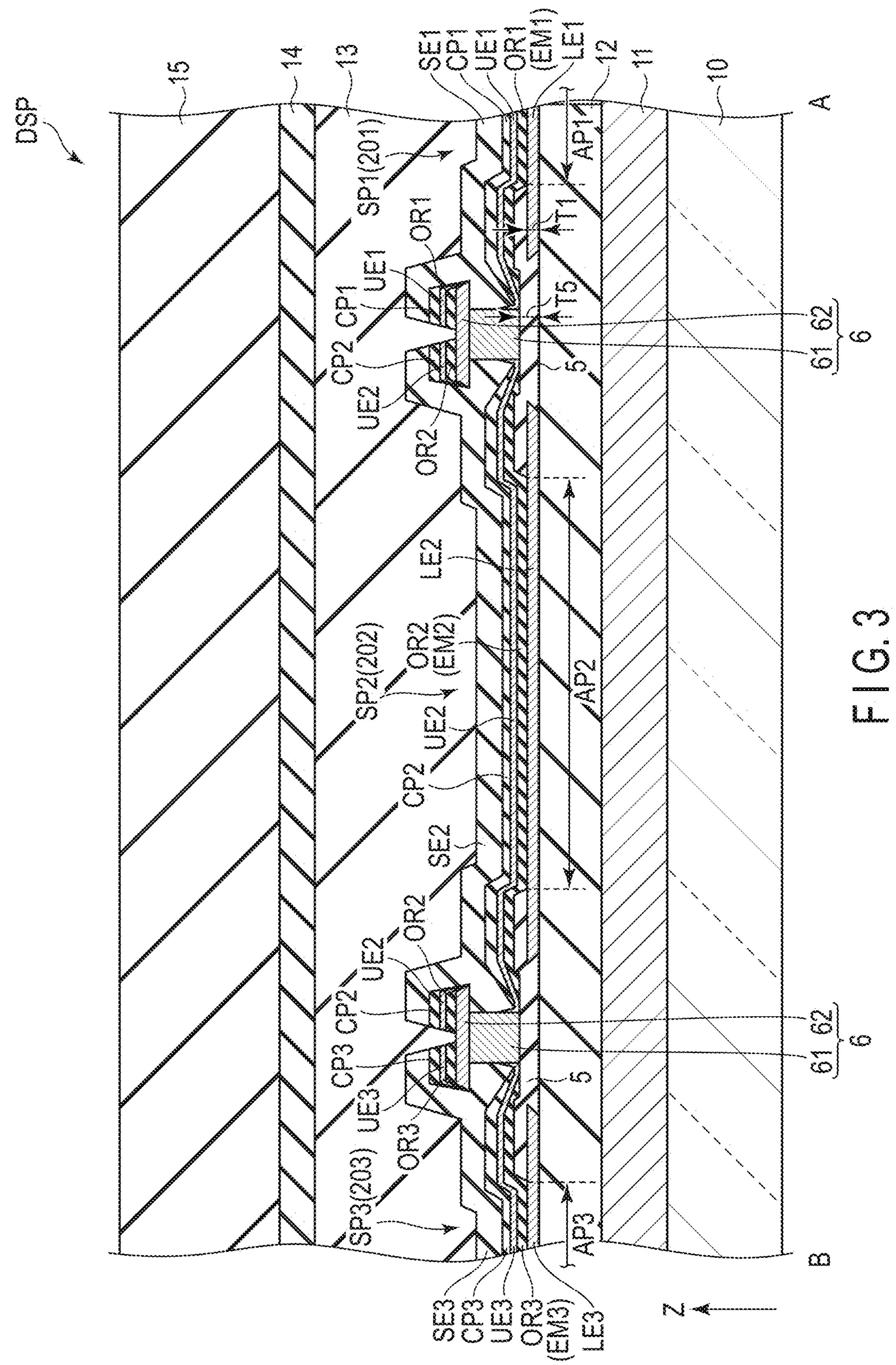
FIG. 3 is a schematic cross-sectional view of the display device DSP along the A-B line of FIG. 2.

FIG. 3 is a schematic cross-sectional view of the display device DSP along the A-B line of FIG. 2.

A circuit layer 11 is provided on the substrate 10. The circuit layer 11 includes various circuits such as the pixel circuit 1 shown in FIG. 1 and various lines such as the scanning line GL, the signal line SL and the power line PL. The circuit layer 11 is covered with an insulating layer 12. The insulating layer 12 is an organic insulating layer which planarizes the irregularities formed by the circuit layer 11.

The lower electrodes LE1, LE2 and LE3 are provided on the insulating layer 12 and are spaced apart from each other. In the example shown in the figure, each of the lower electrodes LE1, LE2 and LE3 comprises a section having an inverse tapered shape (trapezoidal shape). In other words, regarding the lower electrodes LE1, LE2 and LE3, the width of the lower surface which is in contact with the insulating layer 12 is less than that of the upper surface in a cross-sectional view. Thicknesses T1 of the lower electrodes LE1, LE2 and LE3 are substantially equal to each other and are, for example, 50 to 200 nm.

The rib 5 is provided on the insulating layer 12 and the lower electrodes LE1, LE2 and LE3. The aperture AP1 of the rib 5 overlaps the lower electrode LE1. The aperture AP2 overlaps the lower electrode LE2. The aperture AP3 overlaps the lower electrode LE3. The end portions of the lower electrodes LE1, LE2 and LE3 are covered with the rib 5. Between, of the lower electrodes LE1, LE2 and LE3, the lower electrodes which are adjacent to each other, the insulating layer 12 is covered with the rib 5. Thickness T5 of the rib 5 is greater than thickness T1 of the lower electrode LE1, etc., and is, for example, 200 to 400 nm.

The partition 6 includes a conductive lower portion (stem) 61 provided on the rib 5 and an upper portion (shade) 62 provided on the lower portion 61. The lower portion 61 of the partition 6 shown on the right side of the figure is located between the aperture AP1 and the aperture AP2. The lower portion 61 of the partition 6 shown on the left side of the figure is located between the aperture AP2 and the aperture AP3. The upper portion 62 has a width greater than that of the lower portion 61. By this configuration, the both end portions of the upper portion 62 protrude relative to the side surfaces of the lower portion 61. This shape of the partition 6 is called an overhang shape.

The organic layer OR1 is in contact with the lower electrode LE1 through the aperture AP1 and covers the lower electrode LE1 exposed from the aperture AP1. The peripheral portion of the organic layer OR1 is located on the rib 5. The upper electrode UE1 covers the organic layer OR1 and is in contact with the lower portion 61.

The organic layer OR2 is in contact with the lower electrode LE2 through the aperture AP2 and covers the lower electrode LE2 exposed from the aperture AP2. The peripheral portion of the organic layer OR2 is located on the rib 5. The upper electrode UE2 covers the organic layer OR2 and is in contact with the lower portion 61.

The organic layer OR3 is in contact with the lower electrode LE3 through the aperture AP3 and covers the lower electrode LE3 exposed from the aperture AP3. The peripheral portion of the organic layer OR3 is located on the rib 5. The upper electrode UE3 covers the organic layer OR3 and is in contact with the lower portion 61.

In the example of FIG. 3, subpixel SP1 comprises a cap layer CP1 and a sealing layer SE1. Subpixel SP2 comprises a cap layer CP2 and a sealing layer SE2. Subpixel SP3 comprises a cap layer CP3 and a sealing layer SE3. The cap layers CP1, CP2 and CP3 function as optical adjustment layers which improve the extraction efficiency of the light emitted from the organic layers OR1, OR2 and OR3, respectively.

The cap layer CP1 is provided on the upper electrode UE1.

The cap layer CP2 is provided on the upper electrode UE2.

The cap layer CP3 is provided on the upper electrode UE3.

The sealing layer SE1 is provided on the cap layer CP1, is in contact with the partition 6 and continuously covers each member of subpixel SP1.

The sealing layer SE2 is provided on the cap layer CP2, is in contact with the partition 6 and continuously covers each member of subpixel SP2.

The sealing layer SE3 is provided on the cap layer CP3, is in contact with the partition 6 and continuously covers each member of subpixel SP3.

In the example of FIG. 3, the organic layer OR1, the upper electrode UE1 and the cap layer CP1 are partly located on the partition 6 around subpixel SP1. These portions are spaced apart from, of the organic layer OR1, the upper electrode UE1 and the cap layer CP1, the portions located in the aperture AP1 (the portions constituting the display element 201).

Similarly, the organic layer OR2, the upper electrode UE2 and the cap layer CP2 are partly located on the partition 6 around subpixel SP2. These portions are spaced apart from, of the organic layer OR2, the upper electrode UE2 and the cap layer CP2, the portions located in the aperture AP2 (the portions constituting the display element 202).

Similarly, the organic layer OR3, the upper electrode UE3 and the cap layer CP3 are partly located on the partition 6 around subpixel SP3. These portions are spaced apart from, of the organic layer OR3, the upper electrode UE3 and the cap layer CP3, the portions located in the aperture AP3 (the portions constituting the display element 203).

The end portions of the sealing layers SE1, SE2 and SE3 are located above the partition 6. In the example of FIG. 3, the end portions of the sealing layers SE1 and SE2 located above the partition 6 between subpixels SP1 and SP2 are spaced apart from each other. The end portions of the sealing layers SE2 and SE3 located above the partition 6 between subpixels SP2 and SP3 are spaced apart from each other.

The sealing layers SE1, SE2 and SE3 are covered with a resin layer 13. The resin layer 13 is covered with a sealing layer 14. The sealing layer 14 is covered with a resin layer 15.

Each of the sealing layers SE1, SE2 and SE3 and the sealing layer 14 is formed of, for example, an inorganic insulating material such as silicon nitride (SiNx). Each of the sealing layers SE1, SE2 and SE3 and the sealing layer 14 may be formed of another inorganic insulating material such as silicon oxide (SiOx), silicon oxynitride (SiON) or aluminum oxide ($Al_2O_3$).

The lower portion 61 of the partition 6 is formed of a conductive material and is electrically connected to the upper electrodes UE1, UE2 and UE3. Both the lower portion 61 and the upper portion 62 of the partition 6 may be formed of conductive materials.

Each of the lower electrodes LE1, LE2 and LE3 is, for example, a multilayer body including a transparent electrode formed of an oxide conductive material such as indium tin oxide (ITO) and a metal electrode formed of a metal material such as silver.

The organic layer OR1 includes a light emitting layer EM1. The organic layer OR2 includes a light emitting layer EM2. The organic layer OR3 includes a light emitting layer EM3. The light emitting layer EM1, the light emitting layer EM2 and the light emitting layer EM3 are formed of materials which are different from each other. For example, the light emitting layer EM1 is formed of a material which emits light in a blue wavelength range. The light emitting layer EM2 is formed of a material which emits light in a green wavelength range. The light emitting layer EM3 is formed of a material which emits light in a red wavelength range.

Each of the organic layers OR1, OR2 and OR3 includes a plurality of functional layers such as a hole injection layer, a hole transport layer, an electron blocking layer, a hole blocking layer, an electron transport layer and an electron injection layer.

Each of the upper electrodes UE1, UE2 and UE3 is formed of, for example, a metal material such as an alloy of magnesium and silver (MgAg).

Each of the cap layers CP1, CP2 and CP3 is a multilayer body consisting of a plurality of thin films. All of the thin films are transparent and have refractive indices different from each other. It should be noted that at least one of the cap layers CP1, CP2 and CP3 may be omitted.

The rib 5 is formed of an inorganic insulating material. In the configuration example shown in the figure, the rib 5 is a single-layer body and is formed of tetraethoxysilane ($Si(OC_2H_5)_4$) as an example of a silicon oxide containing carbon.
Tetraethoxysilane may be simply called TEOS in some cases.

Figure 4:
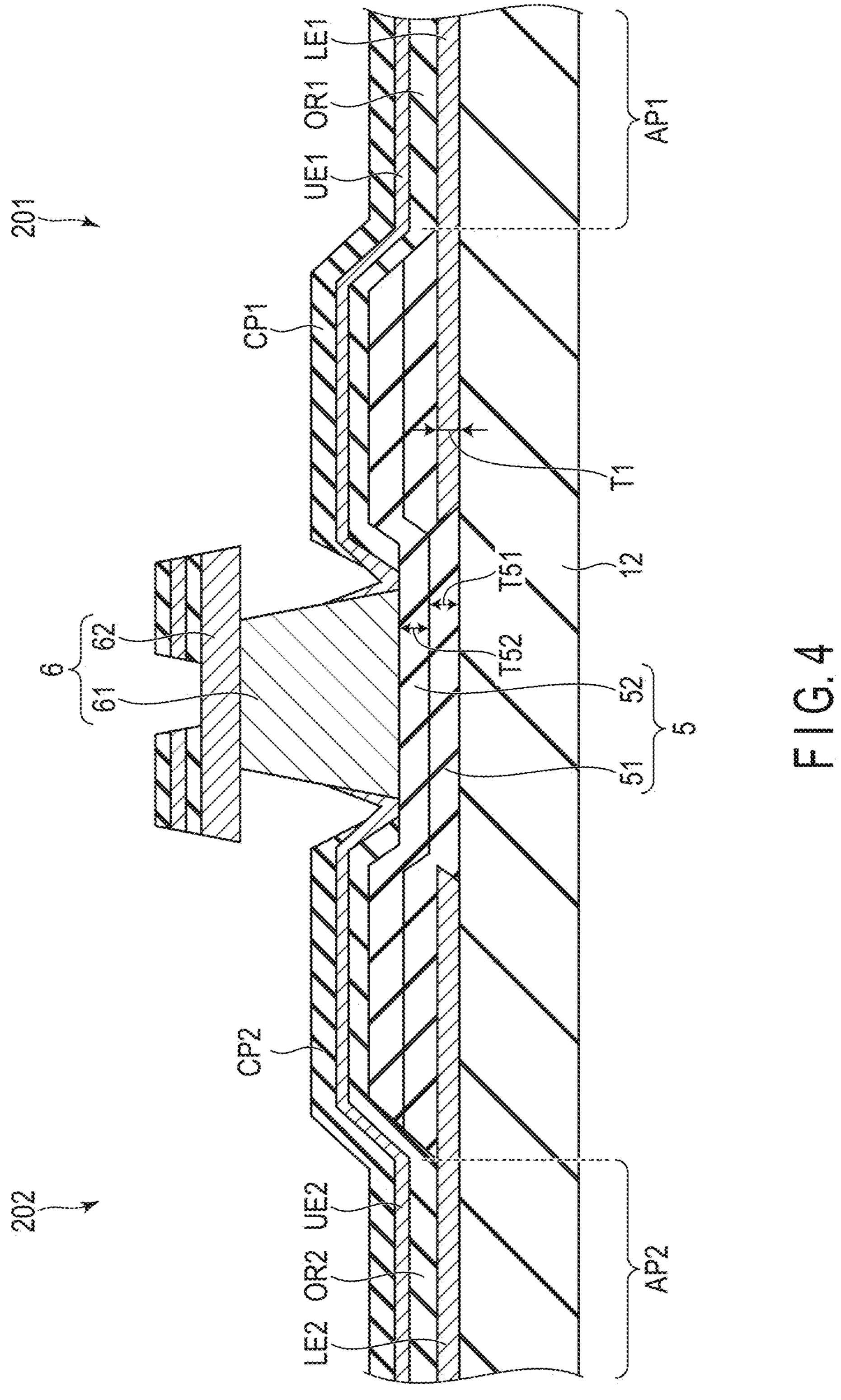
FIG. 4 is an enlarged sectional view showing another configuration example of the rib 5 shown in FIG. 3.

FIG. 4 is an enlarged sectional view showing another configuration example of the rib 5 shown in FIG. 3.

FIG. 4 shows the rib 5 located between the display element 201 and the display element 202. In FIG. 4, the illustrations of the lower layers than the insulating layer 12 are omitted, and the illustrations of the higher layers than the cap layers CP1 and CP2 are omitted.

The rib 5 comprises a first rib layer 51 and a second rib layer 52. The first rib layer 51 covers the end portions of the lower electrodes LE1 and LE2 and covers the insulating layer 12. The second rib layer 52 is located on the first rib layer 51. Thus, in the example shown in the figure, the rib 5 is formed of a multilayer body consisting of the first rib layer 51 and the second rib layer 52.

For example, thickness T51 of the first rib layer 51 is greater than thickness T1 of the lower electrode LE1, etc. Thickness T52 of the second rib layer 52 is equal to thickness T51. However, thickness T52 may be different from thickness T51.

The first rib layer 51 is formed of TEOS.

The second rib layer 52 is formed of an inorganic insulating material which does not contain carbon, such as silicon oxide (SiOx), silicon oxynitride (SiON) or silicon nitride (SiNx). It should be noted that the second rib layer 52 should be preferably formed of a material which is different from the materials of the sealing layers SE1 and SE2, etc., shown in FIG. 3. For example, when the sealing layer SE1 is formed of silicon nitride, the second rib layer 52 should be preferably formed of silicon oxide or silicon oxynitride.

It should be noted that the rib 5 located between the display element 202 and the display element 203 and the rib 5 located between the display element 201 and the display element 203 are configured in a manner similar to that of the rib 5 shown in FIG. 4.

In the example shown in FIG. 4, the rib 5 is formed of a multilayer body consisting of two layers. However, the rib 5 may be formed of a multilayer body consisting of three or more layers.

The organic layer OR1 is provided on the second rib layer 52 immediately above the end portion of the lower electrode LE1. The organic layer OR1 is spaced apart from the partition 6. The upper electrode UE1 covers the organic layer OR1 and is in contact with the partition 6. The upper electrode UE1 covers the rib 5 between the partition 6 and the organic layer OR1. The cap layer CP1 is located on the upper electrode UE1.

The organic layer OR2 is provided on the second rib layer 52 immediately above the end portion of the lower electrode LE2. The organic layer OR2 is spaced apart from the partition 6. The upper electrode UE2 covers the organic layer OR2 and is in contact with the partition 6. The upper electrode UE2 covers the rib 5 between the partition 6 and the organic layer OR2. The cap layer CP2 is located on the upper electrode UE2.

In this manner, both the rib 5 of the configuration example shown in FIG. 3 and the first rib layer 51 of the configuration example shown in FIG. 4 are formed of TEOS. TEOS has an excellent covering property and can assuredly cover the end portions of the lower electrodes LE1, LE2 and LE3. In other words, the rib 5 shown in FIG. 3 and the first rib layer 51 shown in FIG. 4 are attached firmly to the end portions of the lower electrodes LE1, LE2 and LE3. Even if each of the lower electrodes LE1, LE2 and LE3 is formed so as to comprise a section having an inverse tapered shape, the formation of a void is prevented between the lower electrodes and the rib.

When a void is formed between the lower electrodes and the rib, a crack may be generated in the rib 5 based on the void. This crack of the rib 5 could be a dispersion path of moisture contained in the insulating layer 12. The insulating layer 12 is an organic insulating layer and has a high permeability compared to inorganic insulating layers. Thus, if a crack is generated in the rib 5, the moisture of the insulating layer 12 may pass through the crack via the end portion of the lower electrode LE1. When the crack penetrates the rib 5, the organic layer OR1 located on the rib 5 is damaged by the moisture dispersed from the insulating layer 12, thereby causing the degradation of the organic layer OR1.

As described above, in the present embodiment, the rib 5 or the first rib layer 51 is attached firmly to the end portions of the lower electrodes LE1, LE2 and LE3. Thus, the formation of a void is prevented. Further, in the rib 5, the formation of a crack based on a void is prevented. In this manner, the dispersion path of the moisture contained in the insulating layer 12 is blocked. This configuration prevents the organic layer OR1 located on the rib 5 from degrading because of moisture. In this manner, the reduction in reliability can be prevented.

Now, this specification explains the manufacturing method of the display device DSP. In FIG. 5 to FIG. 17, the illustrations of the lower layers than the insulating layer 12 are omitted.

Figure 5:
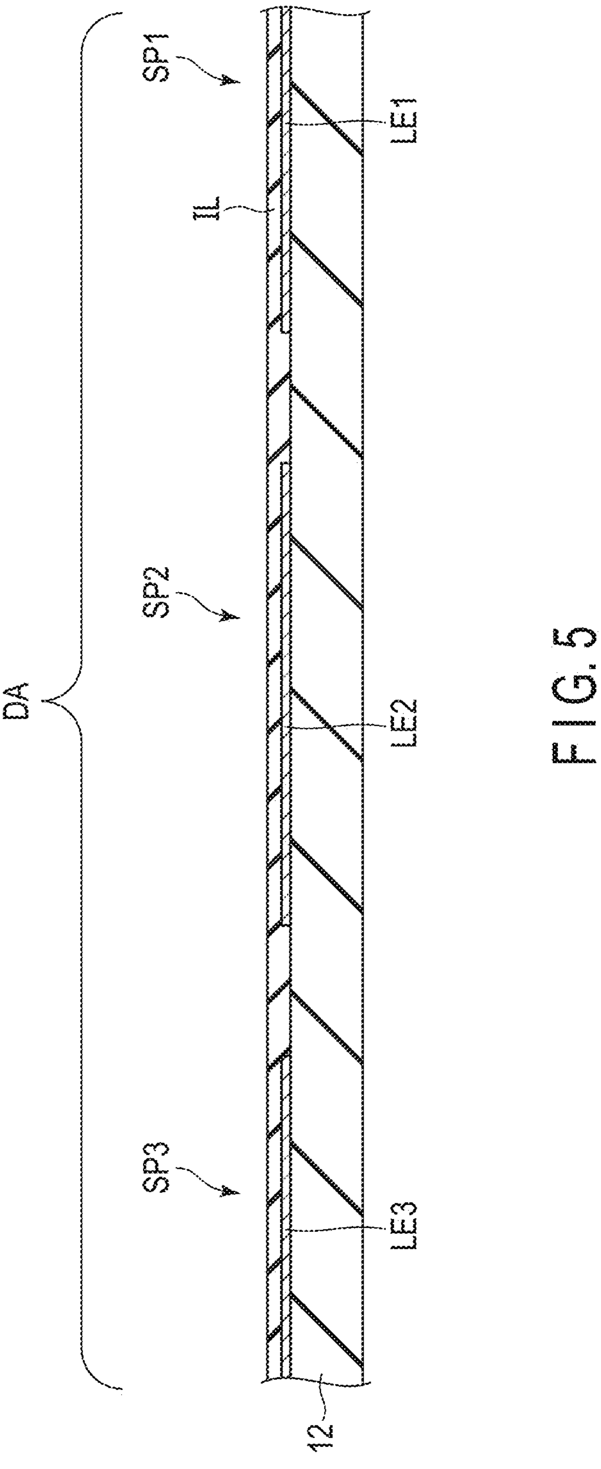
FIG. 5 is a diagram for explaining the manufacturing method of the display device DSP.

First, as shown in FIG. 5, the lower electrode LE1 of subpixel SP1, the lower electrode LE2 of subpixel SP2 and the lower electrode LE3 of subpixel SP3 are formed on the insulating layer 12.

Subsequently, an insulating layer IL which covers the lower electrodes LE1, LE2 and LE3 is formed by depositing an inorganic insulating material over the entire display area DA. The insulating layer IL is formed by, for example, chemical vapor deposition (CVD). The rib 5 shown in FIG. 3 or FIG. 4 is formed by patterning the insulating layer IL.

The formation method of the insulating layer IL is explained below.

Figure 6:
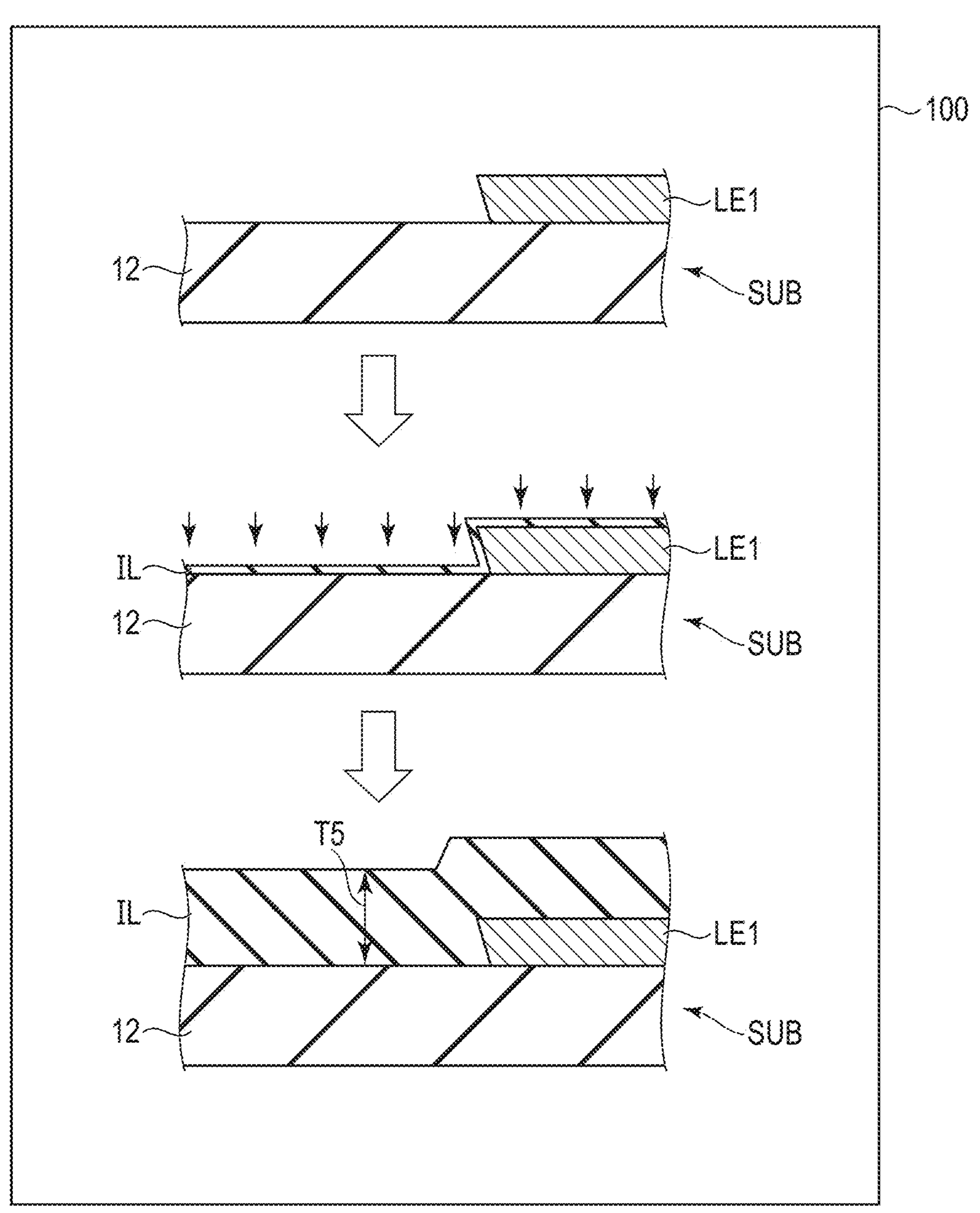
FIG. 6 is a diagram for explaining an example of the formation method of an insulating layer IL.

FIG. 6 is a diagram for explaining an example of the formation method of the insulating layer IL.

First, a processing substrate SUB comprising the lower electrode LE1, etc., on the insulating layer 12 is carried in a CVD device 100 (the upper part of FIG. 6).

In the CVD device 100, after a reactive gas is introduced into a chamber, plasma is generated. Thus, TEOS, which is an inorganic insulating material, is deposited on the processing substrate SUB. TEOS is attached to the upper surface of the insulating layer 12 and the side surface and upper surface of the lower electrode LE1. At this time, TEOS has a good fluidity on the surface of each portion and grows by getting into gaps. Thus, TEOS is attached firmly to the insulating layer 12 and the lower electrode LE1 without forming a void (the middle part of FIG. 6).

In this manner, the insulating layer IL having thickness T5 is formed (the lower part of FIG. 6). The insulating layer IL is thicker than the lower electrode LE1. After the formation of the insulating layer IL, the processing substrate SUB is carried out of the CVD device 100.

By this process, the insulating layer IL for forming the rib 5 shown in FIG. 3 is formed.

As an example of the conditions for forming the insulating layer IL, the temperature is 200° C., and the evaporation rate is 200 nm/min. Thickness T5 is 400 nm.

Figure 7:
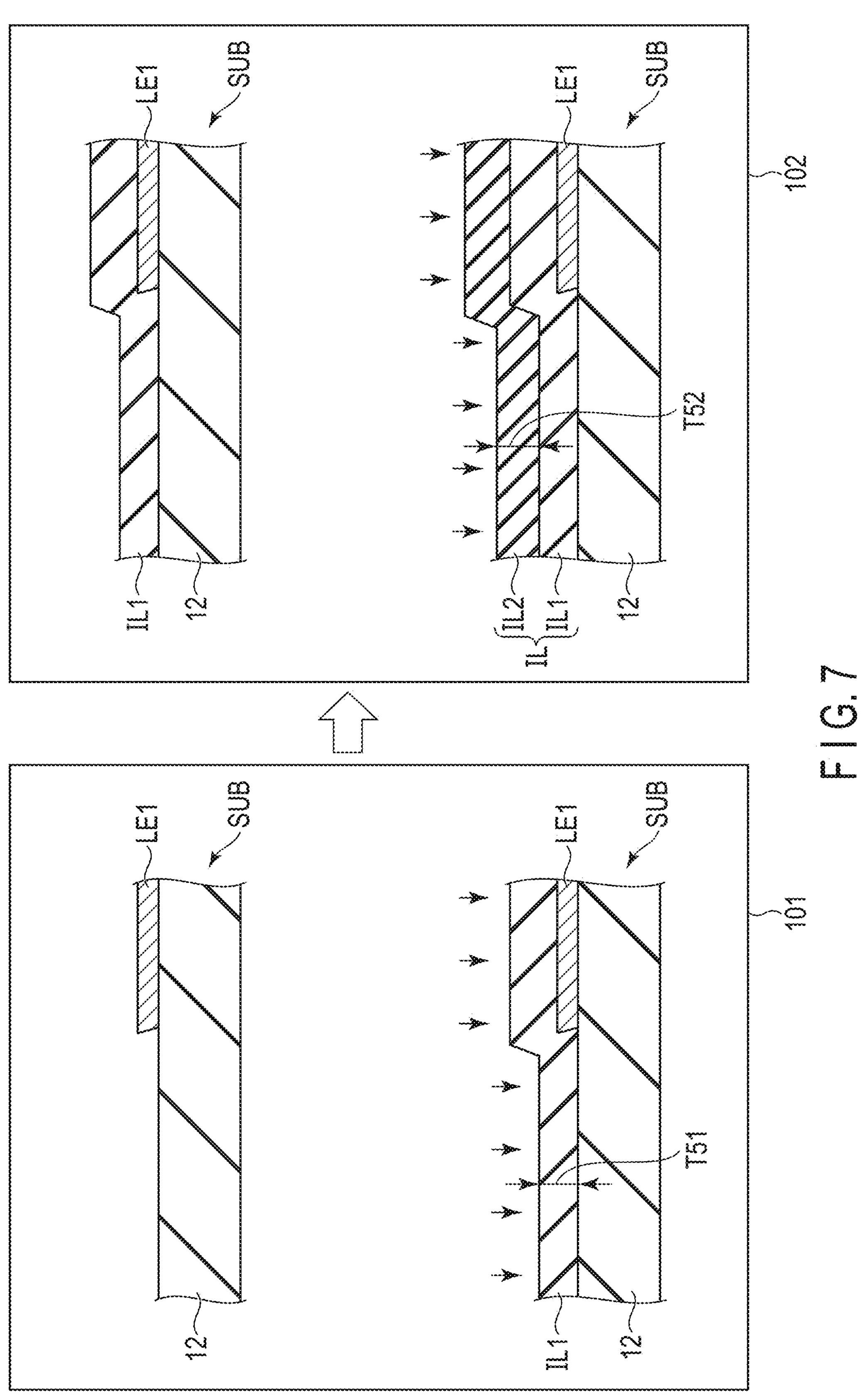
FIG. 7 is a diagram for explaining another example of the formation method of the insulating layer IL.

FIG. 7 is a diagram for explaining another example of the formation method of the insulating layer IL.

First, a processing substrate SUB comprising the lower electrode LE1, etc., on the insulating layer 12 is carried in a first CVD device 101 (the upper part of the left side of FIG. 7). In the first CVD device 101, after a reactive gas is introduced into a chamber, plasma is generated. Thus, TEOS, which is an inorganic insulating material, is deposited on the processing substrate SUB.

In this manner, a first insulating layer IL1 having thickness T51 is formed (the lower part of the left side of FIG. 7). Thickness T51 is thicker than the lower electrode LE1. After the formation of the first insulating layer IL1, the processing substrate SUB is carried out of the first CVD device 101.

Subsequently, the processing substrate SUB in which the first insulating layer IL1 is formed is carried in a second CVD device 102 (the upper part of the right side of FIG. 7). In the second CVD device 102, after a monosilane ($SiH_4$)-based gas is introduced into a chamber as a reactive gas, plasma is generated. Thus, an inorganic insulating material is deposited on the processing substrate SUB. Here, the inorganic insulating material is one of silicon nitride, silicon oxide and silicon oxynitride.

After the formation of a second insulating layer IL2 having thickness T52 (the lower part of the right side of FIG. 7), the processing substrate SUB is carried out of the second CVD device 102.

By this process, an insulating layer IL for forming the rib 5 shown in FIG. 4 is formed.

Subsequently, the partition 6 which comprises the lower portion 61 located on the insulating layer IL and formed of a conductive material and the upper portion 62 located on the lower portion 61 and protruding from the side surfaces of the lower portion 61 is formed.

Figure 8:
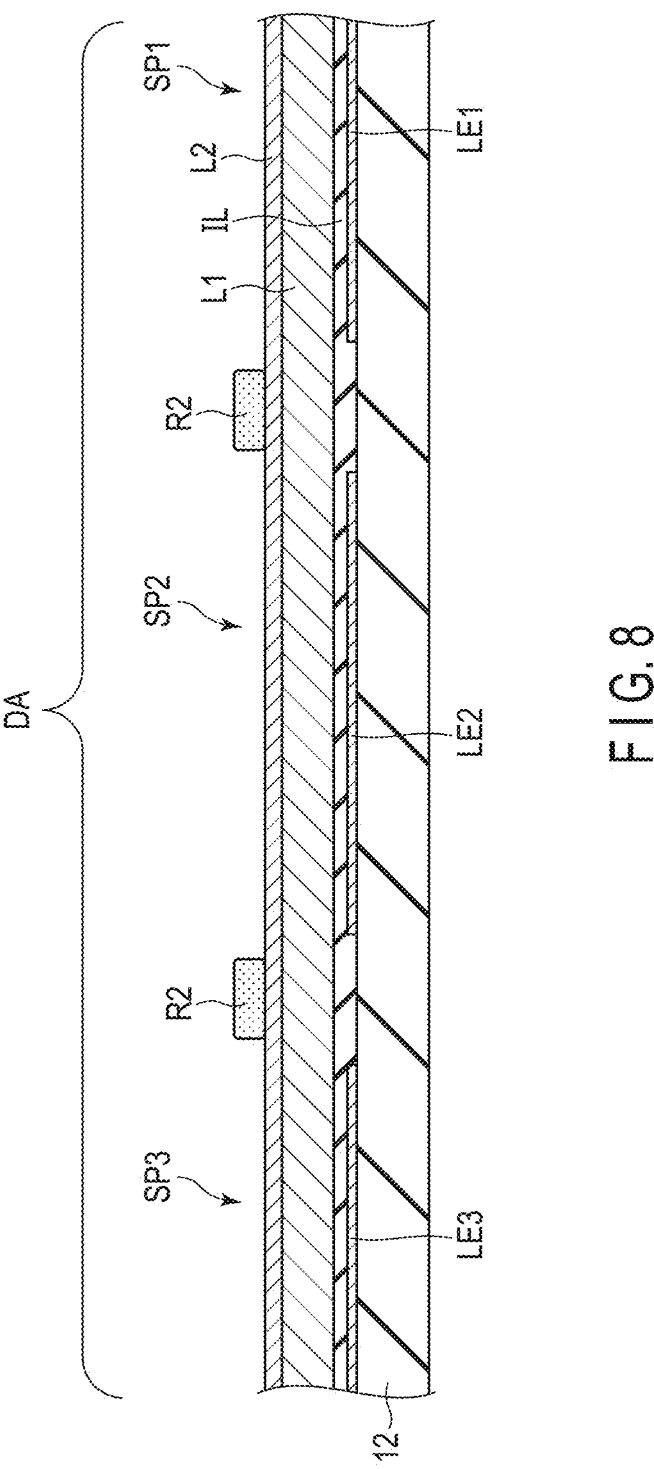
FIG. 8 is a diagram for explaining the manufacturing method of the display device DSP.

In the process of forming the partition 6, first, as shown in FIG. 8, a first layer L1 including a conductive layer is formed on the insulating layer IL. Subsequently, a second layer L2 is formed on the first layer L1. The conductive layer of the first layer L1 is formed of a conductive material such as aluminum. The second layer L2 may be formed of a conductive material or may be formed of an insulating material. Subsequently, a resist R2 having a predetermined shape is formed on the second layer L2.

Figure 9:
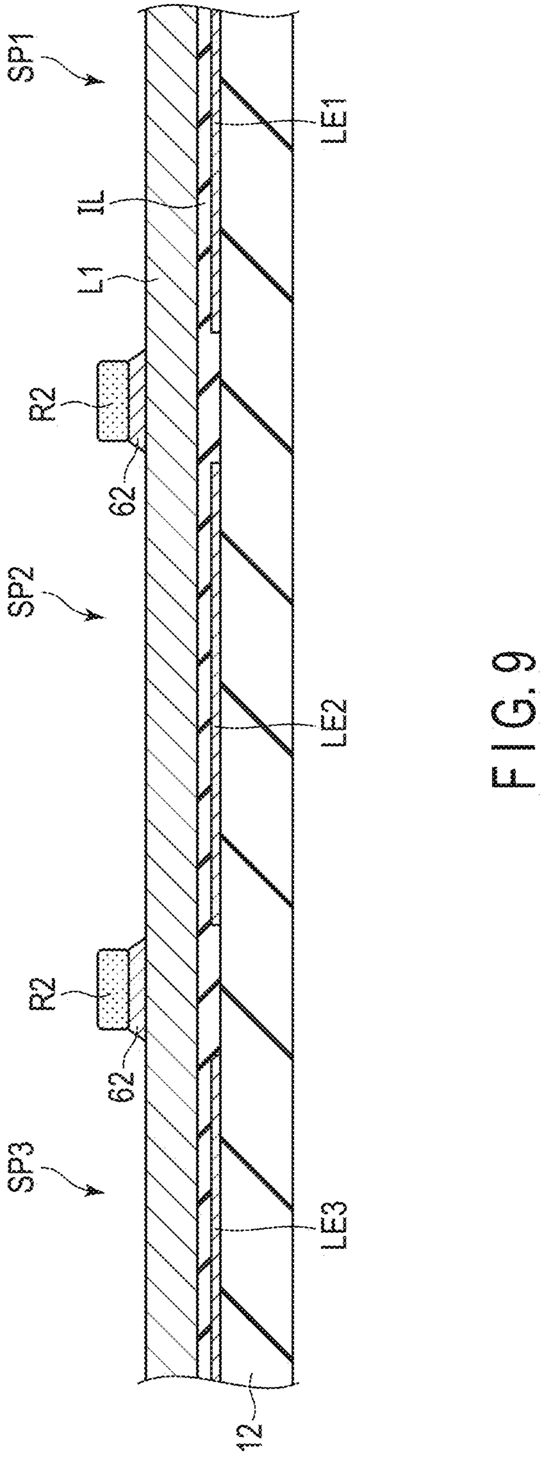
FIG. 9 is a diagram for explaining the manufacturing method of the display device DSP.

Subsequently, as shown in FIG. 9, the second layer L2 is patterned by etching using the resist R2 as a mask. By this process, the upper portion 62 constituting the partition 6 is formed.

Figure 10:
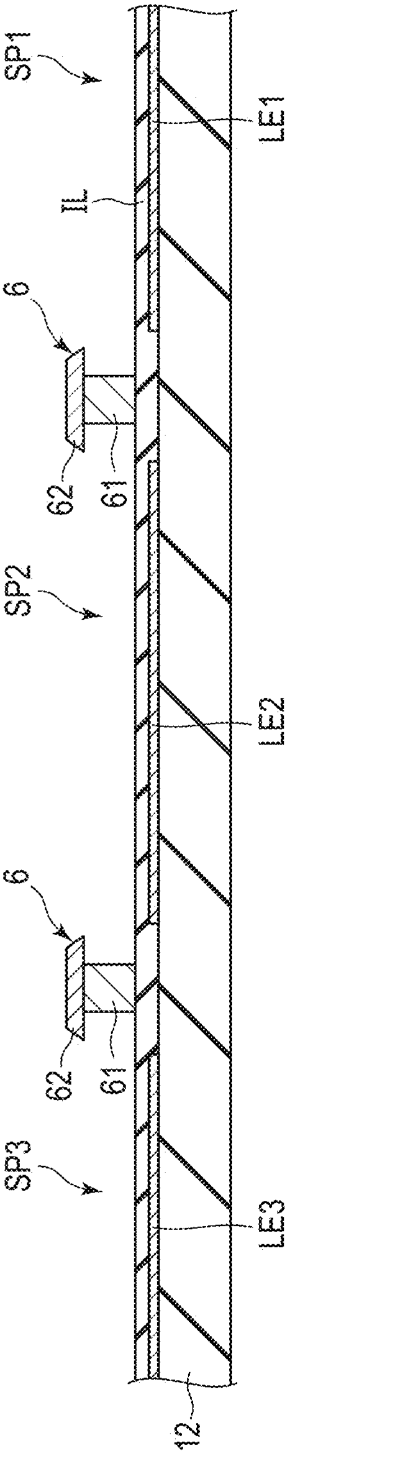
FIG. 10 is a diagram for explaining the manufacturing method of the display device DSP.

Subsequently, as shown in FIG. 10, the first layer L1 is patterned by anisotropic etching and isotropic etching using the resist R2 as a mask. By this process, the lower portion 61 constituting the partition 6 is formed. Subsequently, the resist R2 is removed.

In this manner, the partition 6 comprising the lower portion 61 and the upper portion 62 and having an overhang shape is formed.

Subsequently, as shown in FIG. 11, the apertures AP1, AP2 and AP3 which overlap the lower electrodes LE1, LE2 and LE3 are formed by patterning the insulating layer IL.

For example, the insulating layer IL is partly removed by anisotropic dry etching using the upper portion 62 of the partition 6 as a mask. Thus, the rib 5 comprising the apertures AP1, AP2 and AP3 is formed.

As another example, after forming a resist which individually covers the partition 6, anisotropic dry etching may be performed to remove, of the insulating layer IL, the portion exposed from the resist. Subsequently, the resist may be removed to form the rib 5.

Alternatively, the partition 6 may be formed after the formation of the aperture AP1, etc., of the rib 5.

Subsequently, the display element 201 is formed.

First, as shown in FIG. 12, the organic layer OR1 is formed by depositing the materials for forming the hole injection layer, the hole transport layer, the electron blocking layer, the light emitting layer (EM1), the hole blocking layer, the electron transport layer, the electron injection layer, etc., on the lower electrode LE1 in series using the partition 6 as a mask.

Subsequently, the upper electrode UE1 is formed by depositing a mixture of magnesium and silver on the organic layer OR1 using the partition 6 as a mask. The upper electrode UE1 covers the organic layer OR1 and is in contact with the side surface of the lower portion 61.

Subsequently, the cap layer CP1 is formed by depositing a high-refractive material and a low-refractive material on the upper electrode UE1 using the partition 6 as a mask.

Subsequently, the sealing layer SE1 is formed so as to continuously cover the cap layer CP1 and the partition 6 by depositing an inorganic insulating material in a CVD device.

The organic layer OR1, the upper electrode UE1, the cap layer CP1 and the sealing layer SE1 are formed in at least the entire display area DA and are provided in subpixels SP2 and SP3 as well as subpixel SP1. The organic layer OR1, the upper electrode UE1 and the cap layer CP1 are divided by the partition 6 having an overhang shape.

The materials which are emitted from an evaporation source when the organic layer OR1, the upper electrode UE1 and the cap layer CP1 are formed by vapor deposition are blocked by the upper portion 62. Thus, each of the organic layer OR1, the upper electrode UE1 and the cap layer CP1 is partly stacked on the upper portion 62.

Figure 13:
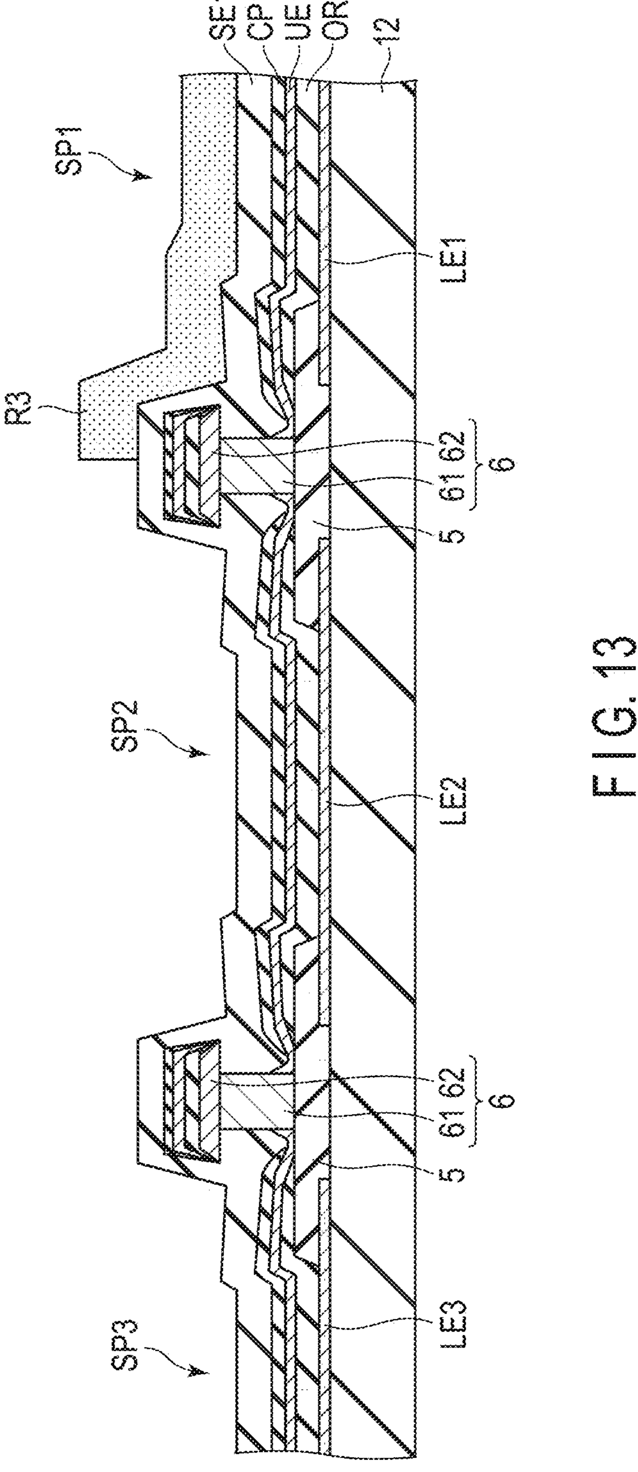
FIG. 13 is a diagram for explaining the manufacturing method of the display device DSP.

Subsequently, as shown in FIG. 13, a resist R3 having a predetermined shape is formed on the sealing layer SE1. The resist R3 overlaps subpixel SP1 and part of the partition 6 around subpixel SP1.

Figure 14:
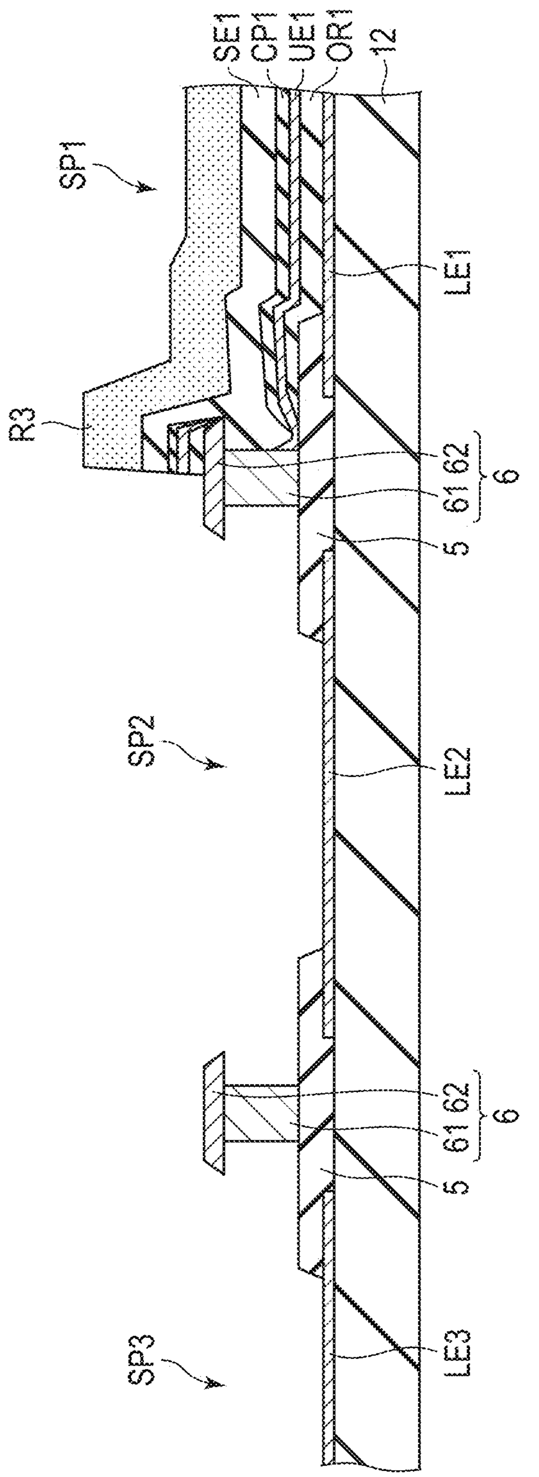
FIG. 14 is a diagram for explaining the manufacturing method of the display device DSP.

Subsequently, as shown in FIG. 14, the sealing layer SE1, cap layer CP1, upper electrode UE1 and organic layer OR1 exposed from the resist R3 are removed in series by etching using the resist R3 as a mask. In this manner, the lower electrode LE2 of subpixel SP2 and the lower electrode LE3 of subpixel SP3 are exposed.

Figure 15:
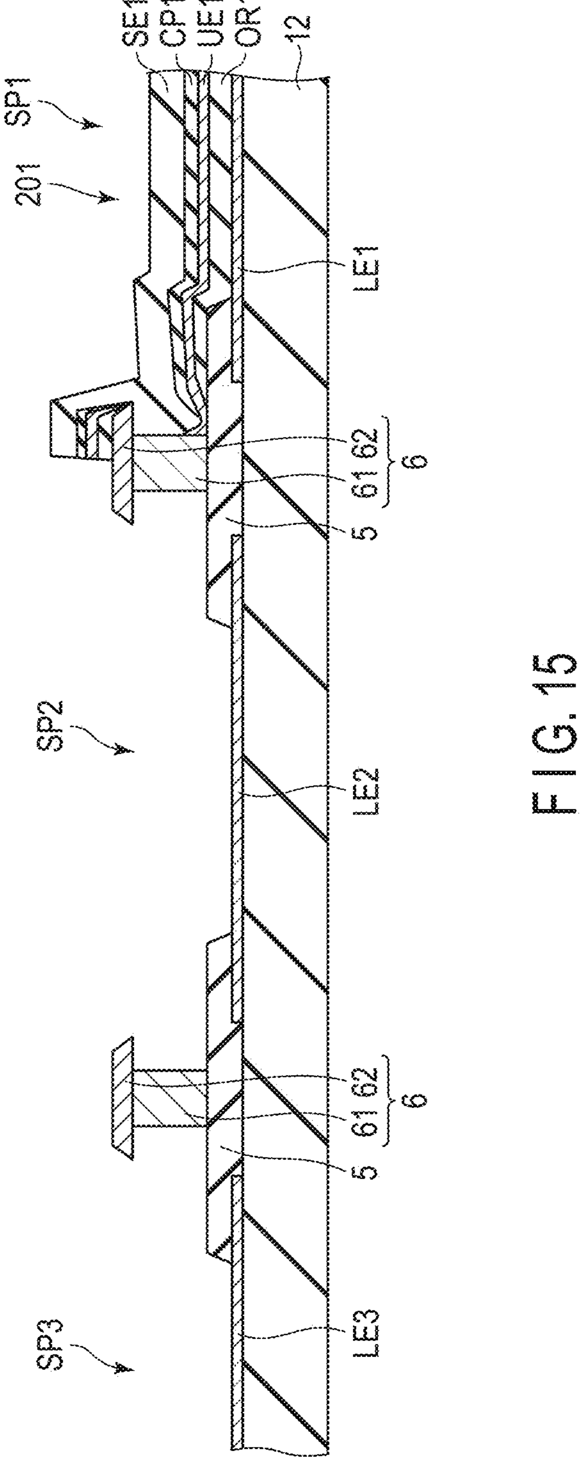
FIG. 15 is a diagram for explaining the manufacturing method of the display device DSP.

Subsequently, as shown in FIG. 15, the resist R3 is removed. By this process, the display element 201 is formed in subpixel SP1.

Figure 16:
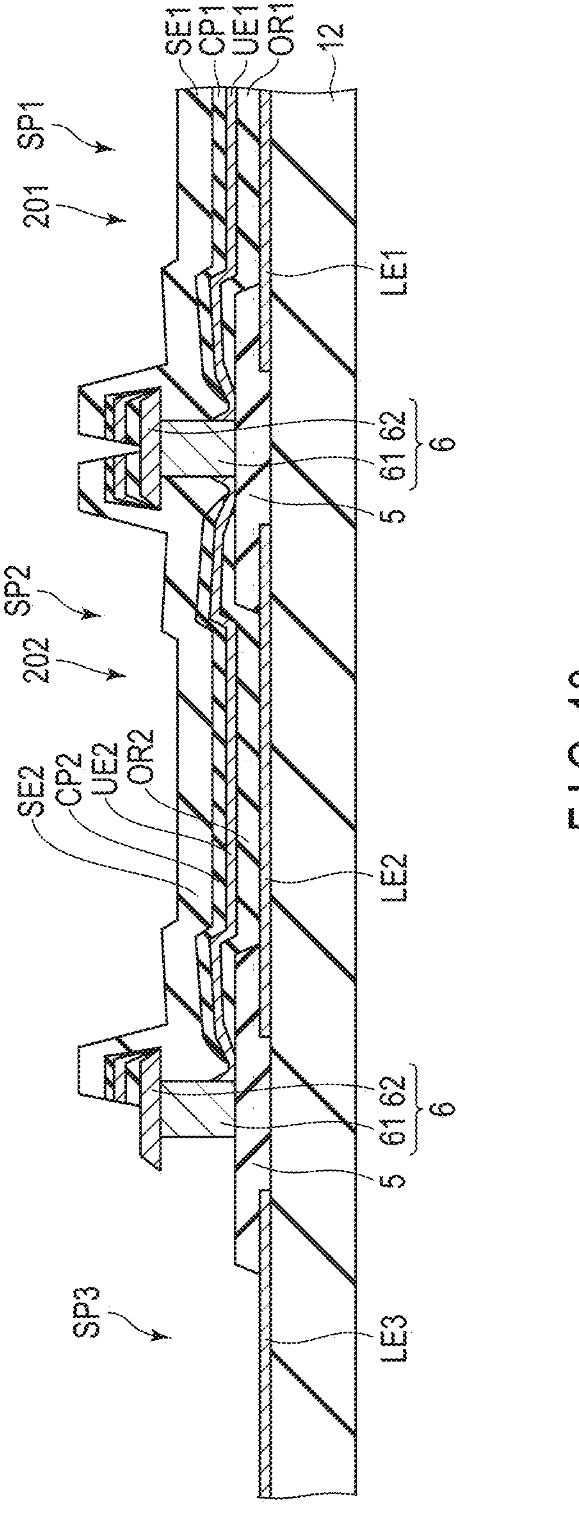
FIG. 16 is a diagram for explaining the manufacturing method of the display device DSP.

Subsequently, as shown in FIG. 16, the display element 202 is formed. The procedure of forming the display element 202 is similar to that of forming the display element 201. Specifically, the organic layer OR2 including the light emitting layer EM2, the upper electrode UE2, the cap layer CP2 and the sealing layer SE2 are formed in order on the lower electrode LE2. Subsequently, a resist is formed on the sealing layer SE2. The sealing layer SE2, the cap layer CP2, the upper electrode UE2 and the organic layer OR2 are patterned in series by etching using the resist as a mask. After this patterning, the resist is removed. In this manner, the display element 202 is formed in subpixel SP2, and the lower electrode LE3 of subpixel SP3 is exposed.

Figure 17:
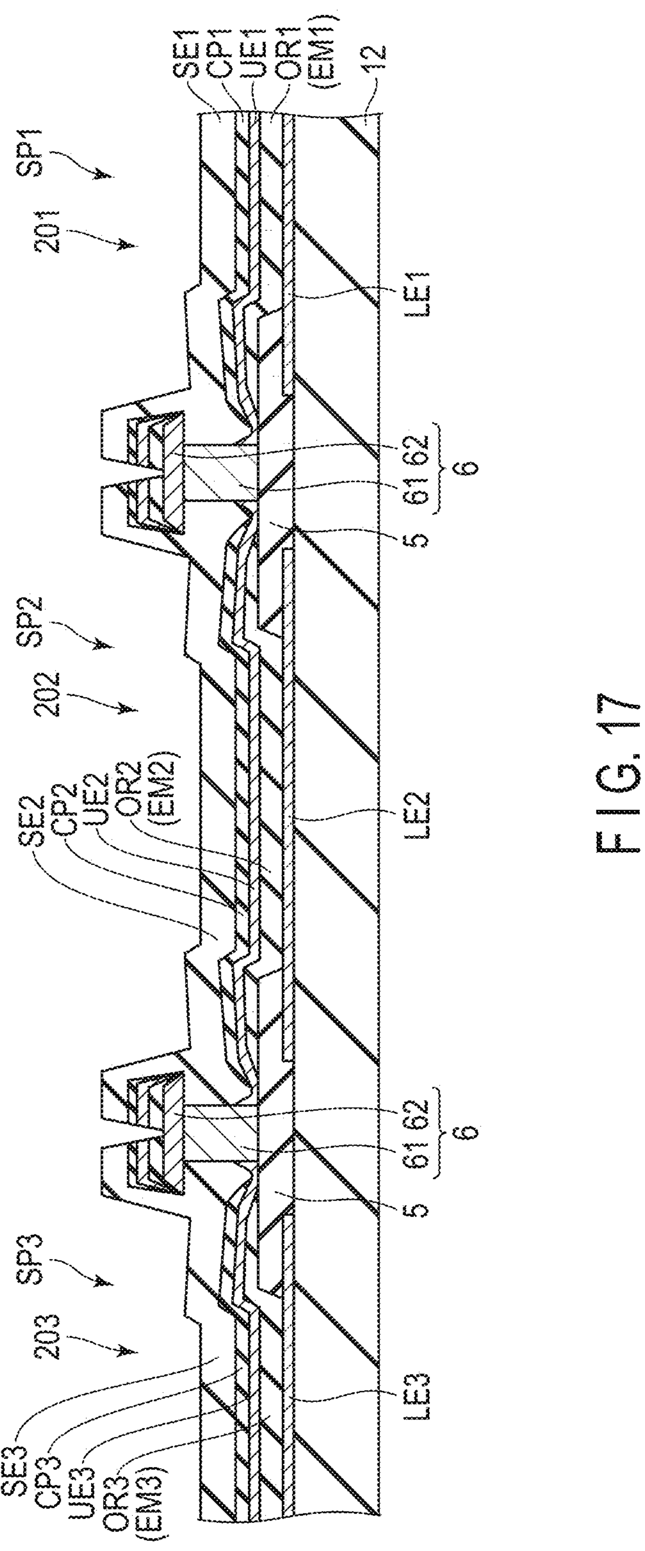
FIG. 17 is a diagram for explaining the manufacturing method of the display device DSP.

Subsequently, as shown in FIG. 17, the display element 203 is formed. The procedure of forming the display element 203 is similar to that of forming the display element 201.

Specifically, the organic layer OR3 including the light emitting layer EM3, the upper electrode UE3, the cap layer CP3 and the sealing layer SE3 are formed in order on the lower electrode LE3. Subsequently, a resist is formed on the sealing layer SE3. The sealing layer SE3, the cap layer CP3, the upper electrode UE3 and the organic layer OR3 are patterned in series by etching using the resist as a mask. After this patterning, the resist is removed. By this process, the display element 203 is formed in subpixel SP3.

Subsequently, the resin layer 13, sealing layer 14 and resin layer 15 shown in FIG. 3 are formed in order. By this process, the display device DSP is completed. In the manufacturing process described above, this specification assumes a case where the display element 201 is formed firstly, and the display element 202 is formed secondly, and the display element 203 is formed lastly. However, the formation order of the display elements 201, 202 and 203 is not limited to this example.

As explained above, the present embodiment can provide a display device and a manufacturing method of a display device such that the reduction in reliability can be prevented.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A manufacturing method of a display device, comprising:

forming a lower electrode;

forming an insulating layer which covers the lower electrode;

forming a partition which comprises a lower portion located on the insulating layer and formed of a conductive material and an upper portion located on the lower portion and protruding from a side surface of the lower portion;

forming an aperture which overlaps the lower electrode by patterning the insulating layer;

forming an organic layer including a light emitting layer, on the lower electrode; and forming an upper electrode which covers the organic layer and is in contact with the lower portion of the partition, wherein the insulating layer is formed of tetraethoxysilane (TEOS).

2. The manufacturing method of claim 1, wherein the insulating layer is formed so as to be thicker than the lower electrode.

3. The manufacturing method of claim 1, further comprising
forming a cap layer on the upper electrode after forming the upper electrode, wherein
the organic layer, the upper electrode and the cap layer are formed by vapor deposition using the partition as a mask.

4. The manufacturing method of claim 3, further comprising
forming a sealing layer which continuously covers the cap layer and the partition by depositing an inorganic insulating material after forming the cap layer.

5. The manufacturing method of claim 4, further comprising:
forming a resist on the sealing layer after forming the sealing layer; and
removing the sealing layer, the cap layer, the upper electrode and the organic layer exposed from the resist in series using the resist as a mask.

6. A manufacturing method of a display device, comprising:
forming a lower electrode;
forming a first insulating layer which covers the lower electrode;
forming a second insulating layer on the first insulating layer;
forming a partition which comprises a lower portion located on the second insulating layer and formed of a conductive material and an upper portion located on the lower portion and protruding from a side surface of the lower portion;
forming an aperture which overlaps the lower electrode by patterning the second insulating layer and the first insulating layer in series;
forming an organic layer including a light emitting layer, on the lower electrode; and
forming an upper electrode which covers the organic layer and is in contact with the lower portion of the partition, wherein
the first insulating layer is formed of tetraethoxysilane (TEOS).

7. The manufacturing method of claim 6, wherein
the second insulating layer is formed of silicon nitride (SiN), silicon oxide (SiO) or silicon oxynitride (SiON).

8. The manufacturing method of claim 6, wherein
the first insulating layer is formed so as to be thicker than the lower electrode.

9. The manufacturing method of claim 6, wherein
the first insulating layer is formed by a first CVD device, and
the second insulating layer is formed by a second CVD device which is different from the first CVD device.

10. The manufacturing method of claim 6, further comprising
forming a cap layer on the upper electrode after forming the upper electrode, wherein
the organic layer, the upper electrode and the cap layer are formed by vapor deposition using the partition as a mask.

11. The manufacturing method of claim 10, further comprising
forming a sealing layer which continuously covers the cap layer and the partition by depositing an inorganic insulating material after forming the cap layer.

12. The manufacturing method of claim 11, further comprising:
forming a resist on the sealing layer after forming the sealing layer; and
removing the sealing layer, the cap layer, the upper electrode and the organic layer exposed from the resist in series using the resist as a mask.

13. A display device comprising:
a substrate;
a lower electrode provided above the substrate;
a rib which covers an end portion of the lower electrode and comprises an aperture overlapping the lower electrode;
a partition which comprises a lower portion provided on the rib and formed of a conductive material and an upper portion provided on the lower portion and protruding from a side surface of the lower portion;
an organic layer provided on the lower electrode and including a light emitting layer; and
an upper electrode which covers the organic layer and is in contact with the lower portion of the partition, wherein
the rib is formed of tetraethoxysilane (TEOS).

14. The display device of claim 13, wherein
the rib is thicker than the lower electrode.

15. The display device of claim 13, wherein
the lower electrode comprises a section having an inverse tapered shape, and
a void is not included between the lower electrode and the rib.

16. The display device of claim 13, further comprising:
a cap layer provided on the upper electrode; and
a sealing layer which covers the cap layer and the partition, wherein
the sealing layer is formed of an inorganic insulating material which is different from the rib.

17. The display device of claim 13, wherein
the lower electrode comprises a section having an inverse tapered shape, and
a void is not included between the lower electrode and the rib.

18. A display device comprising:
a substrate;
a lower electrode provided above the substrate;
a rib which comprises an aperture overlapping the lower electrode;
a partition which comprises a lower portion provided on the rib and formed of a conductive material and an upper portion provided on the lower portion and protruding from a side surface of the lower portion;
an organic layer provided on the lower electrode and including a light emitting layer; and
an upper electrode which covers the organic layer and is in contact with the lower portion of the partition, wherein
the rib comprises:
a first rib layer which covers an end portion of the lower electrode and is formed of tetraethoxysilane (TEOS); and
a second rib layer provided on the first rib layer and formed of an inorganic insulating material which is different from the first rib layer.

19. The display device of claim 18, wherein
the second rib layer is formed of silicon nitride (SiN), silicon oxide (SiO) or silicon oxynitride (SiON).

20. The display device of claim 18, wherein
the first rib layer is thicker than the lower electrode.

* * * * *